United States Patent
Lim et al.

(10) Patent No.: US 10,607,519 B2
(45) Date of Patent: Mar. 31, 2020

(54) GATE DRIVING CIRCUIT AND DISPLAY DEVICE INCLUDING THE SAME

(71) Applicant: Samsung Display Co., Ltd, Yongin-si, Gyeonggi-do (KR)

(72) Inventors: Jaekeun Lim, Suwon-si (KR); Chongchul Chai, Seoul (KR); Jonghee Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 44 days.

(21) Appl. No.: 14/980,581

(22) Filed: Dec. 28, 2015

(65) Prior Publication Data

US 2016/0203786 A1    Jul. 14, 2016

(30) Foreign Application Priority Data

Jan. 14, 2015    (KR) .................... 10-2015-0006811

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0426* (2013.01); *G09G 2310/0267* (2013.01); *G09G 2310/0286* (2013.01); *G09G 2320/041* (2013.01); *G09G 2330/028* (2013.01)

(58) Field of Classification Search
CPC ............... G09G 3/20; G09G 2330/028; G09G 2320/041; G09G 2310/0267; G09G 2310/0264; G09G 2300/0426; G09G 2310/0286; G09G 2310/0289; G11C 19/287

See application file for complete search history.

(56) References Cited

U.S. PATENT DOCUMENTS

| | | | |
|---|---|---|---|
| 2003/0164813 A1* | 9/2003 | Fujii | G09G 3/3648 345/101 |
| 2008/0158211 A1* | 7/2008 | Kwon | G01J 1/32 345/207 |
| 2009/0201228 A1* | 8/2009 | Kim | H01L 27/14692 345/60 |
| 2010/0309175 A1* | 12/2010 | Ohtsuki | G09G 3/3648 345/204 |

(Continued)

FOREIGN PATENT DOCUMENTS

| | | |
|---|---|---|
| JP | 2000-131713 A | 5/2000 |
| JP | 2007-017863 A | 1/2007 |

(Continued)

*Primary Examiner* — William Boddie
*Assistant Examiner* — Saifeldin E Elnafia
(74) *Attorney, Agent, or Firm* — Innovation Counsel LLP

(57) ABSTRACT

Provided is a display device. The display device includes a display panel, a gate driving circuit, a sensor part, and a control voltage generator. The gate driving circuit includes driving transistors including a first control electrode and a second control electrode. The sensor part is configured to measure an environmental factor that changes a threshold voltage of the driving transistors. The control voltage generator is configured to apply to the second control electrode a control voltage for controlling the threshold voltage of the driving transistors on the basis of the environmental factor measured by the sensor part.

8 Claims, 14 Drawing Sheets

(56) References Cited

U.S. PATENT DOCUMENTS

| | | | | |
|---|---|---|---|---|
| 2011/0102409 A1* | 5/2011 | Hayakawa | ......... | H01L 27/1225 |
| | | | | 345/212 |
| 2011/0216259 A1* | 9/2011 | Jo | ......................... | G02F 1/136 |
| | | | | 349/41 |
| 2011/0298764 A1* | 12/2011 | Ha | ......................... | G09G 3/20 |
| | | | | 345/207 |
| 2014/0092078 A1 | 4/2014 | Yoon et al. | | |

FOREIGN PATENT DOCUMENTS

| JP | 2010-251735 A | 11/2010 |
|---|---|---|
| KR | 10-2007-0015856 A | 2/2007 |
| KR | 10-2013-0049617 A | 5/2013 |
| KR | 10-2014-0042308 A | 4/2014 |

\* cited by examiner

GATE DRIVING CIRCUIT AND DISPLAY DEVICE INCLUDING THE SAME

CROSS-REFERENCE TO RELATED APPLICATIONS

This U.S. non-provisional patent application claims priority under 35 U.S.C. § 119 of Korean Patent Application No. 10-2015-0006811, filed on Jan. 14, 2015, the entire contents of which are hereby incorporated by reference.

BACKGROUND

The present disclosure herein relates to a gate driving circuit and a display device including the same, and more particularly, to a gate driving circuit including driving transistors integrated on a display panel and including first and second control electrodes, and a display device having excellent reliability.

A display device includes a plurality of gate lines, a plurality of data lines, and a plurality of pixels connected to the plurality of gate lines and the plurality of data lines. The display device includes a gate driving circuit providing gate signals to the plurality of gate lines and a data driving circuit outputting data signals to the plurality of data lines.

The gate driving circuit includes a shift register including a plurality of driving stage circuits (hereinafter, driving stages). The plurality of driving stages output gate signals respectively corresponding to the plurality of gate lines. Each of the plurality of driving stages includes a plurality of driving transistors organically connected.

The threshold voltages of the driving transistors are changed by surrounding environmental factors. When the threshold voltage is changed, the driving characteristics of the driving transistors change, and reliability thereof become lowered.

SUMMARY

The present disclosure provides a gate driving circuit of which a driving characteristic may be maintained uniformly and a display device including the same.

Embodiments of the inventive concept provide display devices including a display panel, a gate driving circuit, a sensor part, and a control voltage generator. The display panel includes a plurality of gate lines, a plurality of data lines, and a plurality of pixels connected to the plurality of gate lines and the plurality of data lines. The gate driving circuit is configured to output gate signals to the plurality of gate lines and includes driving transistors that each include a first control electrode activating a channel and a second control electrode overlapping the first control electrode. The sensor part is configured to measure an environmental factor that changes a threshold voltage of the driving transistors. The control voltage generator is configured to apply to the second control electrode a control voltage for controlling the threshold voltage of the driving transistors on the basis of the environmental factors measured by the sensor part.

In some embodiments, the environmental factor may include at least one of temperature and illumination. The sensor part may include at least one of a temperature sensor configured to measure temperature and an illumination sensor configured to measure illumination.

In some embodiments, the control voltage may be a sum of a first control signal and a second control signal. The first control voltage may be generated based on a temperature and the second control voltage may be generated based on an illumination.

In some embodiments, the first control voltage may be decreased as the temperature is increased. The first control voltage may be increased as the temperature is decreased.

In some embodiments, the second control voltage may be decreased as the illumination is increased. The second control voltage may be increased as the illumination is decreased.

In some embodiments, the first control voltage may be 0 V at a reference temperature. When a temperature measured by the temperature sensor is higher than the reference temperature, the first control voltage may be lower than 0 V. When the temperature measured by the temperature sensor is lower than the reference temperature, the first control voltage may be higher than 0 V. The reference temperature may be about 50° C. to about 70° C.

In some embodiments, the second control voltage may be 0 V at a reference illumination. When an illumination measured by the illumination sensor is higher than the reference illumination, the second control voltage may be lower than 0 V. When the illumination measured by the illumination sensor is lower than the reference illumination, the second control voltage may be higher than 0 V. The reference illumination may be about 300 lux to about 400 lux.

In some embodiments, the display device may further include a memory storing temperature-voltage data for determining the first control voltage on the basis of the temperature measured by the temperature sensor. The memory may further store illumination-voltage data with respect to the second control voltage on the basis of the illumination measured by the illumination sensor.

In some embodiments, the control voltage generator may include a signal controller and an analog voltage generator. The signal controller may be connected to the sensor part and the memory. The signal controller may be configured to generate control voltage data on the basis of the temperature and illumination measured by the sensor part and the data stored in the memory. The analog voltage generator may be configured to generate the control voltage corresponding to the control voltage data.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Hereinafter, an exemplary embodiment of the inventive concept is described in detail with reference to the accompanying drawings.

Figure 1A:
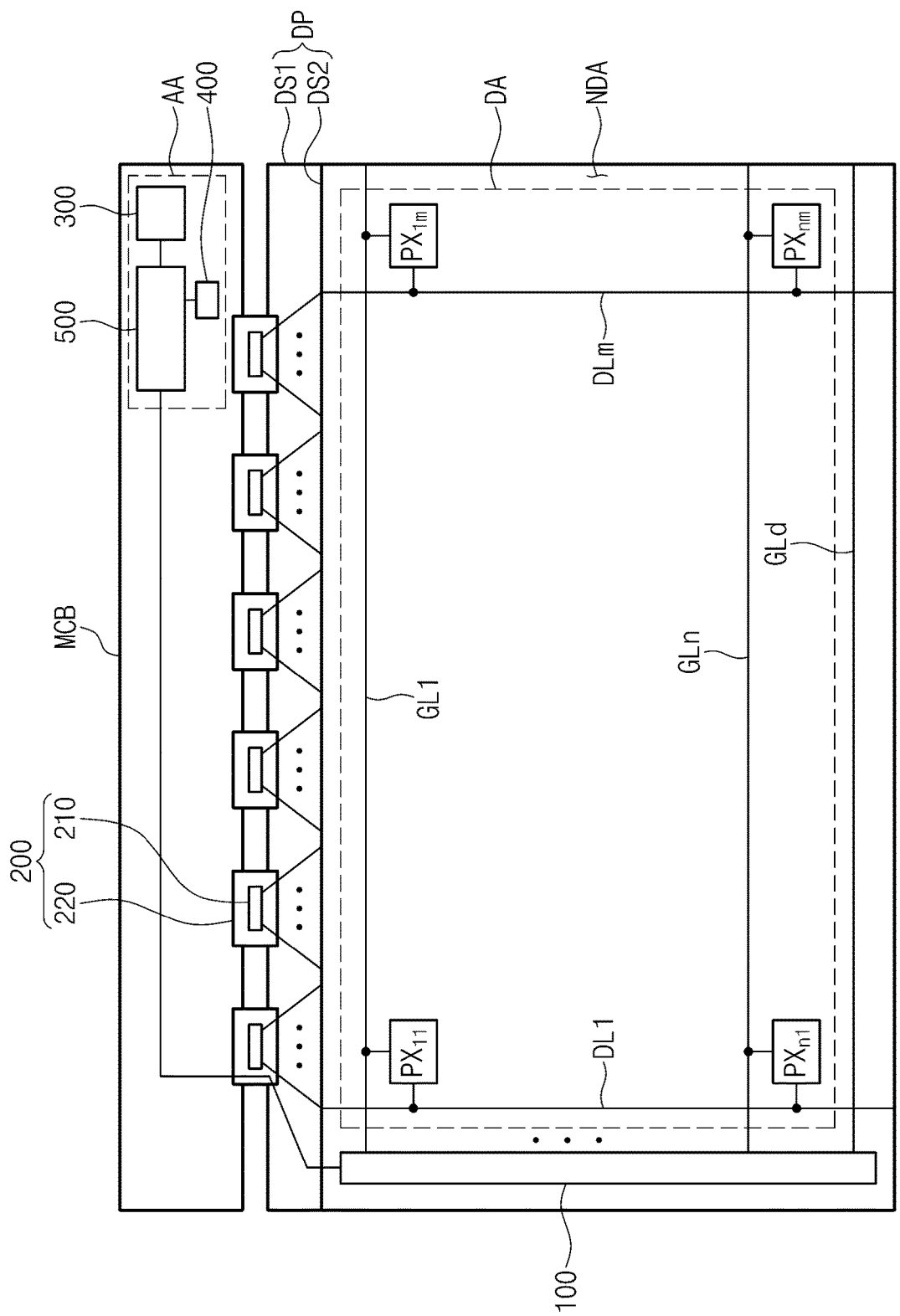
FIG. 1A is a plan view of a display device according to an embodiment of the inventive concept.
Figure 1B:
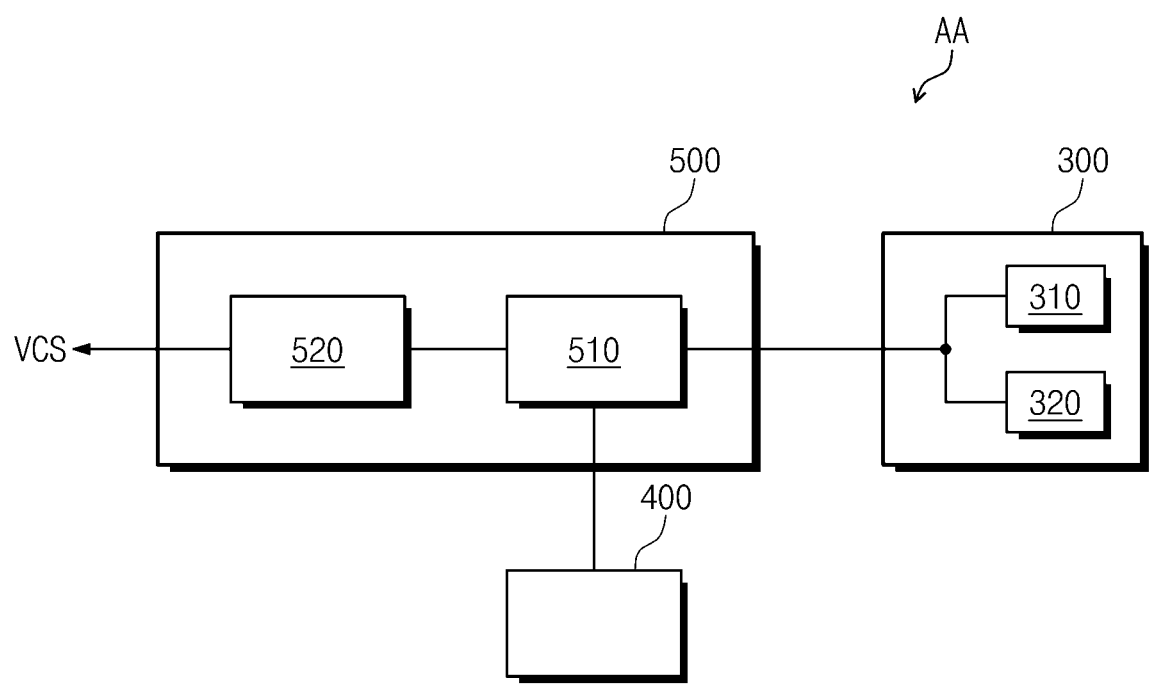
FIG. 1B is a block diagram in which an AA area illustrated in FIG. 1A is enlarged and illustrated.
Figure 2:
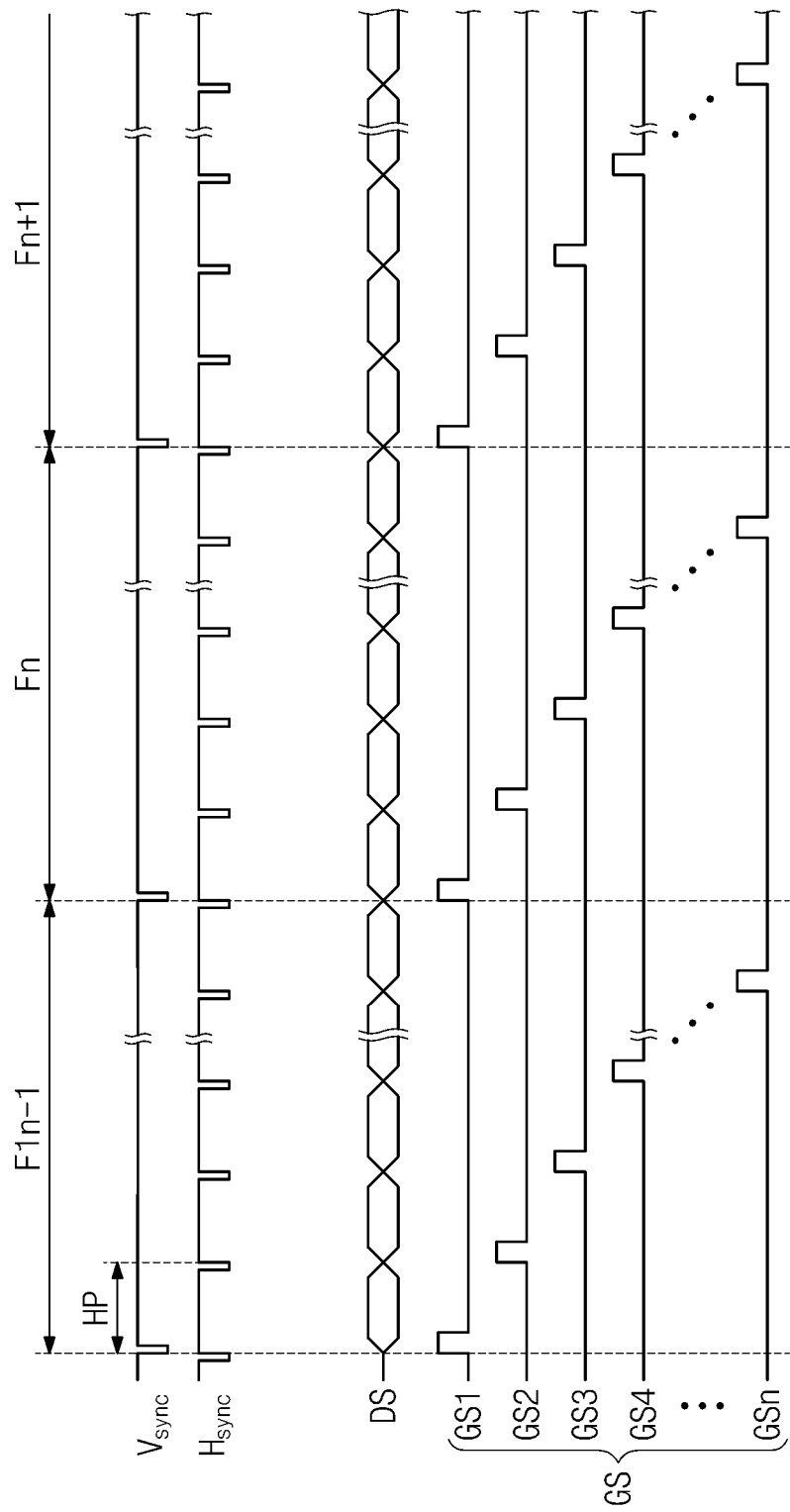
FIG. 2 is a timing diagram of signals of a display device according to an embodiment of the inventive concept.

FIG. 1A is a plan view of a display device according to an embodiment of the inventive concept. FIG. 1B is a block diagram in which an AA area illustrated in FIG. 1A is enlarged and illustrated. FIG. 2 is a timing diagram of signals of a display device according to an embodiment of the inventive concept.

As illustrated in FIGS. 1A and 1B, a display device according to an embodiment of the inventive concept includes a display panel DP, a gate driving circuit 100, a data driving circuit 200, a sensor part 300, a memory 400, and a control voltage generator 500.

The display panel DP is not particularly limited, but may include various display panels, for example, a liquid crystal display panel, an organic light emitting display panel, an electrophoretic display panel, and an electrowetting display panel, etc. The display panel DP in the present embodiment is described with a liquid crystal display panel. Furthermore, a liquid crystal display device including a liquid crystal display panel may further include a polarizer and a backlight unit, etc., which are not illustrated.

The display panel DP may include a first substrate DS1, a second substrate DS2 separated from the first substrate DS1, and a liquid crystal layer LCL disposed between the first and second substrates DS1 and DS2. On the plane, the display panel DP includes a display area DA on which a plurality of pixels $PX_{11}$ to $PX_{nm}$ are disposed and a non-display area NDA surrounding the display area DA.

The display panel DP includes a plurality of gate lines GL1 to GLn disposed on the first substrate DS1 and a plurality of data lines DL1 to DLm intersecting with the gate lines GL1 to GLn. The plurality of gate lines GL1 to GLn are connected to the gate driving circuit 100. The plurality of data lines DL1 to DLm are connected to the data driving circuit 200. FIG. 1A illustrates only parts of the plurality of gate lines GL1 to GLn and the plurality of data lines DL1 to DLm. In addition, the display panel DP may further include a dummy gate line GLd disposed in the non-display area NDA of the first substrate DS1.

FIG. 1A illustrates only a part of the plurality of pixels $PX_{11}$ to $PX_{nm}$. The plurality of pixels $PX_{11}$ to $PX_{nm}$ are respectively connected to a corresponding gate line among the plurality of gate lines GL1 to GLn and a corresponding data line among the plurality of data lines DL1 to DLm. However, the dummy gate line GLd is not connected to the plurality of pixels $PX_{11}$ to $PX_{nm}$.

The plurality of pixels $PX_{11}$ to $PX_{nm}$ may be classified into a plurality of groups according to their display color. The plurality of pixels $PX_{11}$ to $PX_{nm}$ may display one of primary colors. The primary colors may include red, green, blue, and white. Furthermore, the primary colors are not limited hereto and may further include various colors such as yellow, cyan, and magenta.

The gate driving circuit 100 and data driving circuit 200 receive a control signal from a signal controller 510 (e.g., a timing controller). The signal controller 510 may be mounted on a main circuit board (MCB). The signal controller 510 may receive image data and a control signal from an external graphic controller (not illustrated). The control signal may include a vertical sync signal Vsync for distinguishing frame periods Fn−1, Fn, and Fn+1, a horizontal sync signal Hsync for distinguishing horizontal periods HP, for example, a row distinguishing signal, a data enable signal having a high level only for a period during which data is output to indicate when data are input, and a clock signal.

The gate driving circuit 100 generates gate signals GS1 to GSn on the basis of a control signal (hereinafter, a gate control signal) received from the signal controller 510 during the frame periods Fn−1, Fn, and Fn+1, and outputs the gate signals GS1 to GSn to the plurality of gate lines GL1 to GLn. The gate signals GS1 to GSn may be sequentially output in correspondence to the horizontal period HP. The gate driving circuit 100 may be formed through the same thin film process for forming the pixels $PX_{11}$ to $PX_{nm}$. The gate driving circuit 100 may be mounted on the non-display area NDA in a type of an amorphous silicon TFT gate driver circuit or an oxide semiconductor TFT gate driver circuit. The gate driving circuit 100 includes a plurality of driving transistors TRG. At least any one of the driving transistors TRG includes a first control electrode activating a channel or a second control electrode overlapping the first control electrode. A structure of the driving transistors TRG including the second control electrode is described below with reference to FIG. 9.

FIG. 1A exemplarily illustrates one gate driving circuit 100 connected to left ends of the plurality of gate lines GL1 to GLn. In another embodiment of the inventive concept, a display device may include two gate driving circuits. One of the two gate driving circuits may be connected to the left ends of the plurality of gate lines GL1 to GLn, and the other may be connected to the right ends of the plurality of gate lines GL1 to GLn. In addition, one of the two gate driving circuits may be connected to odd numbered gate lines, and the other may be connected to even numbered gate lines.

The data driving circuit 200 generates gradation voltages according to image data provided from the signal controller 510 on the basis of a control signal (hereinafter a data control signal) received from the signal controller 510. The data driving circuit 200 outputs the gradation voltages as data voltages DS to a plurality of data lines DL1 to DLm.

The data voltages DS may include positive polarity data voltages having positive values and/or negative polarity data voltages having negative values with respect to a common voltage. For each of the horizontal periods HP, some of data voltages applied to the data lines DL1 to DLm may have a positive polarity, and the other may have a negative polarity. The polarity of data voltages DS may be inverted according to frame periods Fn−1, Fn and Fn+1 for preventing degradation of the liquid crystal. The data driving circuit 200 may generate inverted data voltages in a unit of a frame period in response to an inversion signal.

The data driving circuit 200 may include a driving chip 210 and a flexible circuit board 220 on which the driving chip 210 is mounted. The data driving circuit 200 may include a plurality of driving chips 210 and flexible circuit board 220. The flexible circuit board 220 electrically connects the main circuit board MCB and the first substrate DS1. The plurality of driving chips 210 provide data signals to corresponding data lines among the plurality of data lines DL1 to DLm.

FIG. 1A exemplarily illustrates a data driving circuit 200 in a tape carrier package (TCP) type. In another embodiment of the inventive concept, the data driving circuit 200 may be disposed in the non-display area NDA of the first substrate DS1 in a chip on glass type.

FIG. 1B is a block diagram illustrating the sensor part 300, the memory 400, and the control voltage generator 500 illustrated in FIG. 1A.

The sensor part 300 measures environmental factors for varying a driving characteristic, such as a threshold voltage, of the driving transistors TRG. The threshold voltage is a voltage at which an amount of a current flowing from an input electrode to an output electrode of a transistor begins to rapidly increase. The sensor part 300 delivers information on the measured environmental factors to the control voltage generator 500. The environmental factors may include, for example, temperature and/or illumination. A description of how the threshold voltage of the driving transistors TRG is varies with temperature and illumination is provided in relation to FIG. 10.

The sensor part 300 may be disposed around the display panel DP or gate driving circuit 100. The sensor part 300 may include a temperature sensor 310 and an illumination sensor 320.

The temperature sensor 310 may measure the temperature around the display panel DP or the gate driving circuit 100. The temperature measured by the temperature sensor 310 may be affected by the temperature outside the display device. In addition, the temperature measured by the temperature sensor 310 may be affected by heat generated inside the display device, for example, radiation heat emitted from electronic components.

The illumination sensor 320 may measure an illumination around the display panel DP or the gate driving circuit 100. The illumination measured by the illumination sensor 320 may be affected by light incident to the inside of the display device from the outside of the display device. In addition, the illumination measured by the illumination sensor 320 may be affected by light generated inside the display device, for example, light leaked from the backlight.

The memory 400 stores data for voltages applied to the second control electrodes (hereinafter, control voltages) in correspondence to the environmental factors. Accordingly, the voltages applied to the second control electrodes of the driving transistors TRG may be determined by the data stored in the memory 400. Thus, temperature-voltage data and/or illumination-voltage data may be stored in the memory 400.

The temperature-voltage data is data for determining voltages (hereinafter, first control voltages) applied to the second control electrodes of the driving transistors TRG according to the temperature around the driving transistors TRG.

The illumination-voltage data is data for determining voltages (hereinafter, second control voltages) applied to the second control electrodes of the driving transistors TRG according to an illumination around the driving transistors TRG.

However, the type of data stored in the memory 400 is not limited hereto. In some embodiments, the temperature and illumination may be stored in one data type in the memory 400 and not in an individual storage type.

The control voltage generator 500 applies the control voltage to the second electrode on the basis of environmental factors measured by the sensor part 300 and data stored in the memory 400. The control voltage generator 500 includes a signal controller 510 and an analog voltage generator 520.

The signal controller 510 is connected to the sensor part and the memory 400. The signal controller 510 creates a control voltage data VCD on the basis of environmental factors measured by the sensor part 300 and data stored in the memory 400, and delivers the control voltage data VCD to the analog voltage generator 520.

The control voltage data VCD may include first and second control voltage data. The first control voltage data is created based on the temperature measured by the temperature sensor 310 and the temperature-voltage data stored in the memory 400. The second control voltage data is created based on the illumination measured by the illumination sensor 320 and the illumination-voltage data stored in the memory 400.

However, the type of the control voltage data VCD is not limited hereto. For example, one control voltage data VCD may be formed as a combination of the first and second control voltage data. In addition, the first and second control voltage data may be created in one control voltage data type VCD in simultaneous consideration of the temperature and illumination and not individually created.

The analog voltage generator 520 may generate a control voltage VCS on the basis of the control voltage data VCD received from the signal controller 510.

The control voltage VCS may be a sum of the first and second control voltages. The first and second control voltages may be summed with different weights. The first control voltage is generated based on the first control voltage data received from the signal controller 510. The second control voltage is generated based on the second control voltage data received from the signal controller 510.

A relationship between the temperature and first control voltage and a relationship between the illumination and second control voltage is described in detail with reference to FIGS. 11A and 11B. In addition, variation of the threshold voltage of the driving transistors TRG according to the control voltages is described in detail with reference to FIG. 12.

However, the generation of the control voltage data VCD is not limited hereto. For example, the first and second control voltages may not be summed after respective generation. Instead, one control voltage may be generated from one control voltage data VCD in simultaneous consideration of the temperature and illumination.

Figure 3:
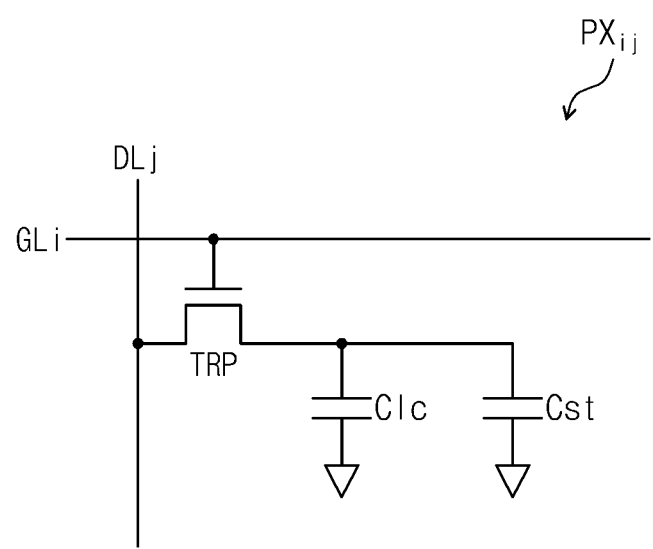
FIG. 3 is an equivalent circuit diagram according to an embodiment of the inventive concept.
Figure 4:
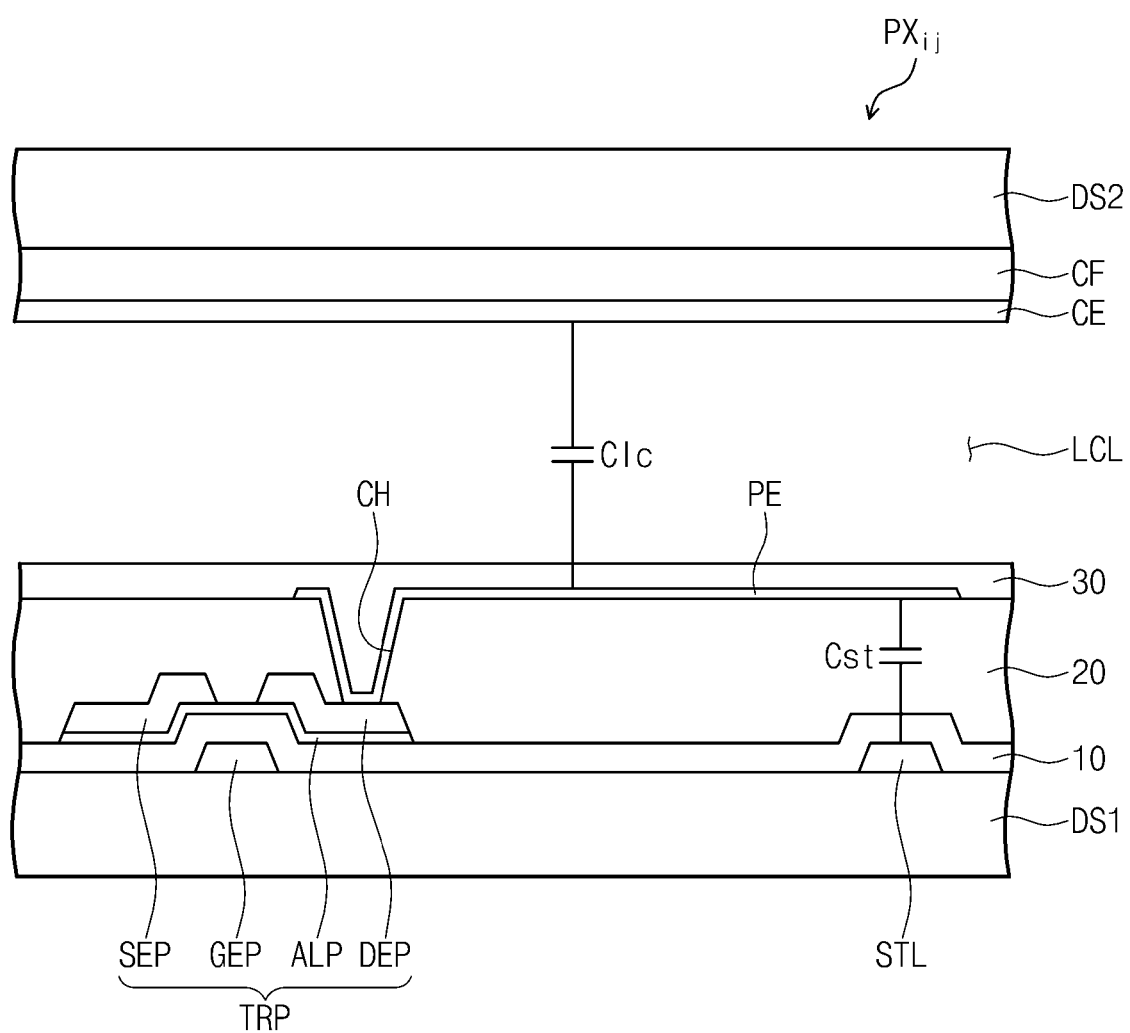
FIG. 4 is a cross-sectional view of a pixel according to an embodiment of the inventive concept.

FIG. 3 is an equivalent circuit diagram according to an embodiment of the inventive concept. FIG. 4 is a cross-sectional view of a pixel according to an embodiment of the inventive concept. Each of the plurality of pixels $PX_{11}$ to $PX_{nm}$ illustrated in FIG. 1 may have the equivalent circuit illustrated in FIG. 3.

As illustrated in FIG. 3, a pixel $PX_{ij}$ includes a pixel thin film transistor TRP (hereinafter pixel transistor), a liquid crystal Clc, and a storage capacitor Cst. Hereinafter, the transistor described throughout the specification refers to a thin film transistor. In some embodiments, the storage capacitor Cst may be omitted.

The pixel transistor TRP is electrically connected to i-th gate line GLi and a j-th data line DLj. The pixel transistor TRP outputs a pixel voltage corresponding to a data signal received from the j-th data line DLj in response to a gate signal received from i-th gate line GLi.

The liquid crystal capacitor Clc is charged with the pixel voltage output from the pixel transistor TRP. According to a charge amount charged to the liquid crystal capacitor Clc, an arrangement of liquid crystal directors included in the liquid crystal layer LCL (see FIG. 3) is changed. The amount of light incident transmitted by the liquid crystal layer varies according to the arrangement of the liquid crystal directors.

The storage capacitor Cst is connected to the liquid crystal capacitor Clc in parallel. The storage capacitor Cst maintains the alignment of the liquid crystal directors for a certain period of time after the pixel transistor TRP is turned off.

As illustrated in FIG. 4, the pixel transistor TRP includes a control electrode GEP (hereinafter pixel control electrode) connected to i-th gate line GLi (see FIG. 2), an activation layer ALP (hereinafter pixel activation layer) overlapping the pixel control electrode GEP, an input electrode SEP (hereinafter, pixel input electrode) connected to the j-th data line DLj (see FIG. 2), and an output electrode DEP (hereinafter pixel output electrode) disposed separate from the pixel input electrode SEP.

The liquid crystal capacitor Clc includes a pixel electrode PE and a common electrode CE. The storage capacitor Cst includes the pixel electrode and a part of a storage line STL overlapping the pixel electrode PE.

The i-th gate line GLi and storage line STL are disposed on one surface of the first substrate DS1. The pixel control polarization GEP is branched from i-th gate line GLi.

The i-th gate line GLi and storage line STL may include a metal such as aluminum (Al), silver (Ag), copper (Cu), molybdenum (Mo), chromium (Cr), tantalum (Ta), or titanium (Ti), or an alloy thereof. The i-th gate line GLi and storage line STL may include a multilayer structure, for example, a titanium layer and a copper layer.

The pixel control electrode GEP and a first insulation layer 10 covering the storage line STL are disposed on one surface of the first substrate DS1. The first insulation layer 10 may include at least any one of an inorganic material and organic material. The first insulation layer 10 may be an organic film or an inorganic film. The first insulation layer 10 may include a multilayer structure, for example, a silicon nitride layer and a silicon oxide layer.

A pixel activation layer ALP overlapping the pixel control electrode GEP is disposed on the first insulation layer 10. The pixel activation layer ALP may include a semiconductor layer (not illustrated) and an ohmic contact layer (not illustrated).

The pixel activation layer ALP may include amorphous silicon or polysilicon. Alternatively, the pixel activation layer ALP may include a metal oxide semiconductor.

A pixel output electrode DEP and a pixel input electrode SEP are disposed on the pixel activation layer ALP. The pixel output electrode DEP and pixel input electrode are disposed separate from each other. Each of the pixel output electrode DEP and pixel input electrode may partially overlap the pixel control electrode GEP.

Even though FIG. 4 illustrates an exemplary pixel transistor TRP having a stacked structure, the structure of the pixel transistor is not limited hereto. The pixel transistor TRP may have a planar structure.

A second insulation layer 20 covering the pixel activation layer ALP, pixel output electrode DEP, and pixel input electrode SEP is disposed on the first insulation layer 10. The second insulation layer 20 provides a flat surface. The second insulation layer 20 may include an organic material.

The pixel electrode PE is disposed on the second insulation layer 20. The pixel electrode PE is connected to the pixel output electrode DEP through a contact hole CH penetrating through the second insulation layer 20. An alignment film 30 covering the pixel electrode PE may be disposed on the second insulation layer 20.

A color filter layer CF is disposed on one surface of the second substrate DS2. A common electrode CE is disposed on the color filter layer CF. A common voltage is applied to the common electrode CE. The common voltage and pixel voltage have different values. An alignment film (not illustrated) covering the common electrode CE may be disposed on the common electrode CE. Another insulation layer (not illustrated) may be disposed between the color filter layer CF and common electrode CE.

The pixel electrode PE and common electrode CE disposed to have a liquid crystal layer LCL intervened in-between form the liquid crystal capacitor Clc. In addition, parts of the pixel electrode PE and storage line STL disposed to have the first and second insulation layers 10 and 20 in-between form the storage capacitor Cst. The storage line STL receives a storage voltage having a value different from that of the pixel voltage. The storage voltage may have the same value as that of the common voltage.

Furthermore, the cross section of a pixel $PX_{ij}$ illustrated in FIG. 4 is just an example. Unlike those illustrated in FIG. 4, at least one of the color filter layer and common electrode may be disposed on the first substrate DS1 according to another embodiment. In other words, a liquid crystal display panel according to an embodiment of the inventive concept may include a pixel in a mode such as a vertical alignment (VA) mode, patterned vertical alignment (PVA) mode, in-plane switching (IPS) mode, fringe-field switching (FFS) mode, or plane to line switching (PLS) mode.

Figure 5:
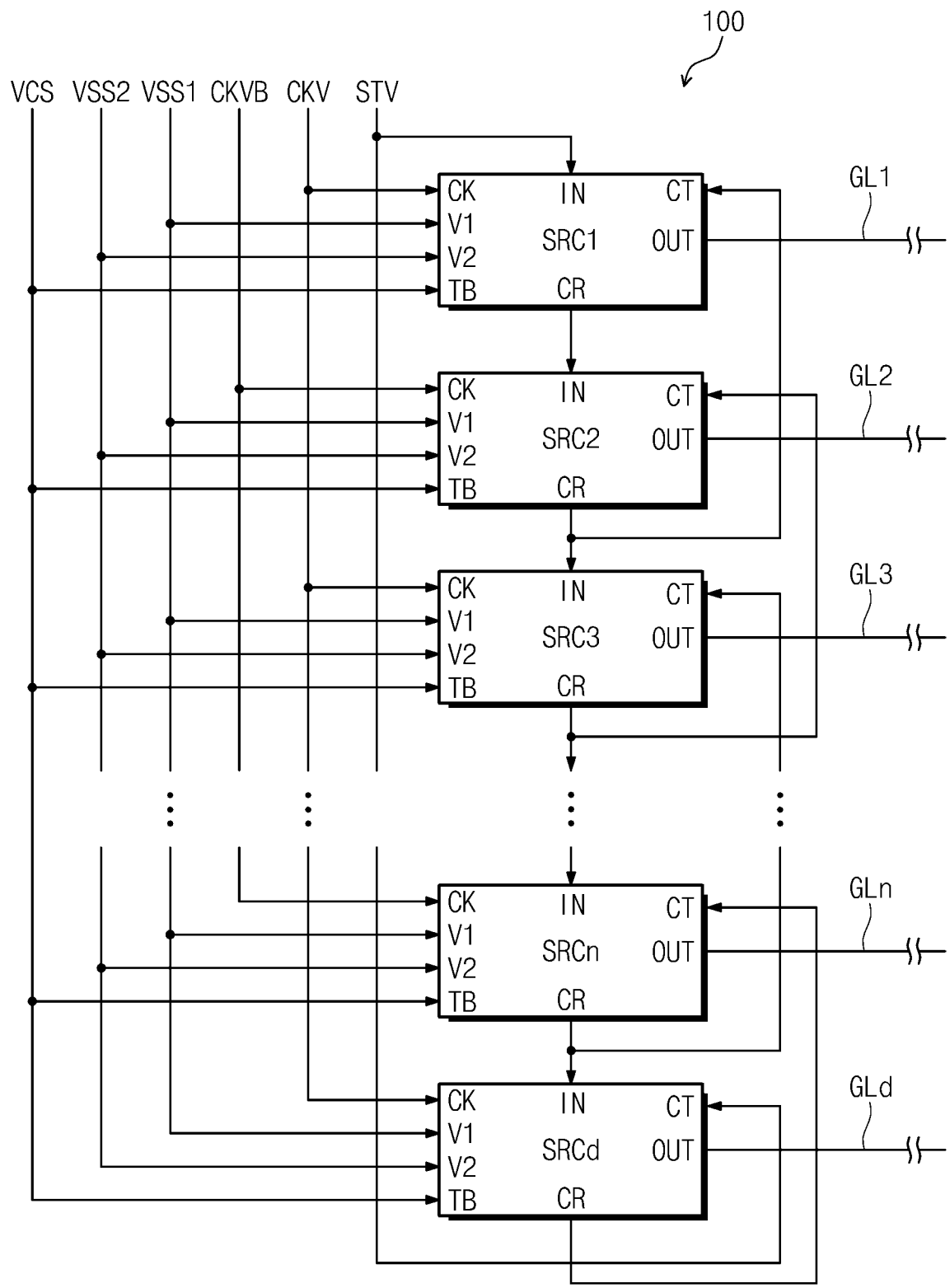
FIG. 5 is a block diagram of a gate driving circuit according to another embodiment of the inventive concept.

FIG. 5 is a block diagram of a gate driving circuit according to an embodiment of the inventive concept. As illustrated in FIG. 5, the gate driving circuit 100 includes a plurality of driving stages SRC1 to SRCn. The plurality of driving stages SRC1 to SRCn may be inter-dependently connected.

The plurality of driving stages SRC1 to SRCn in the present embodiment are respectively connected to the plurality of gate lines GL1 to GLn. The plurality of driving stages SRC1 to SRCn respectively provide the plurality of gate lines GL1 to GLn with gate signals. In an embodiment of the inventive concept, gate lines connected to the plurality of driving stages SRC1 to SRCn may be odd numbered gate lines or even numbered gate lines among the entire gate lines.

The gate driving circuit 100 may further include a dummy stage SRCd connected to the driving stage SRCn disposed on an end of the plurality of driving stages SRC1 to SRCn. The dummy stage SRCd is connected to a dummy gate line GLd.

Each of the plurality of driving stages SRC1 to SRCn includes an output terminal OUT, a carry terminal CR, an input terminal IN, a control terminal CT, a clock terminal CK, a first voltage input terminal V1, a second voltage input terminal V2, and a compensation voltage terminal TB.

The output terminal OUT of each of the plurality of driving stages SRC1 to SRCn is connected to a corresponding gate line among the plurality of gate lines GL1 to GLn. The gate signals generated from the plurality of driving stages SRC1 to SRCn are provided to the plurality of gate lines GL1 to GLn through the output terminals OUT.

The carry terminal CR of each of the plurality of driving stages SRC1 to SRCn is electrically connected to the input terminal IN of the next driving stage of a corresponding driving stage. The carry terminal CR of each of the plurality of driving stages SRC1 to SRCn outputs a carry signal.

The input terminal IN of each of the plurality of driving stages SRC1 to SRCn receives the carry signal of the previous stage of a corresponding driving stage. For example, an input terminal IN of a third driving stage SRC3 receives a carry signal of a second driving stage SRC2. An input terminal IN of a first driving stage SRC1 among the plurality of driving stages SRC1 to SRCn receives a start signal STV for starting to drive the gate driving circuit 100 instead of a carry signal of a previous driving stage.

A control terminal CT of each of the plurality of driving stages SRC1 to SRCn is electrically connected to a carry terminal CR of the next driving stage of a corresponding driving stage. A control terminal CT of each of the plurality of driving stages SRC1 to SRCn receives a carry signal of the next stage of a corresponding driving stage. For example, a control terminal CT of a second driving stage SRC2 receives a carry signal output from a carry terminal CR of a third driving stage SRC3. The control terminal CT of each of the plurality of driving stages SRC1 to SRCn in an embodiment of the inventive concept may be electrically connected to an output terminal OUT of the next driving stage of a corresponding driving stage.

A control terminal CT of the driving stage SRCn disposed on the end receives a carry signal output from a carry terminal CR of the dummy stage SRCd. A control terminal CT of the dummy stage SRCd receives the start signal STV.

The clock terminal CK of each of the plurality of driving stages SRC1 to SRCn receives any one of a first clock signal CKV and a second clock signal CKVB. The clock terminals CK of odd numbered driving stages SRC1 and SRC3 among the plurality of driving stages SRC1 to SRCn may respectively receive the first clock signal CKV. The clock terminals CK of even numbered driving stages SRC2 and SRCn among the plurality of driving stages SRC1 to SRCn may respectively receive the second clock signal CKVB. The first clock signal CKV and the second clock signal CKVB may have different phases.

The first voltage input terminal V1 of each of the plurality of driving stages SRC1 to SRCn receives a first low voltage VSS1. The second voltage input terminal V2 of each of the plurality of driving stages SRC1 to SRCn receives a second low voltage VSS2. The second low voltage VSS2 has a lower level than the first low voltage VSS1.

The compensation voltage terminal TB of each of the plurality of driving stages SRC1 to SRCn receives a control voltage VCS. The control voltage VCS is generated by the control voltage generator 500 (see FIG. 1) and controls a threshold voltage of a driving transistor. The compensation voltage terminal TB of each of the plurality of driving stages SRC1 to SRCn receives the control voltage VCS. The control voltage VCS applied as the threshold voltage TB may be continuously changed in correspondence to a change in environmental factors or maintained constant.

Each of the plurality of driving stages SRC1 to SRCn in some embodiments of the inventive concept may omit any one of the output terminal OUT, carry terminal CR, input terminal IN, control terminal CT, clock terminal CK, first voltage input terminal V1, second voltage input terminal V2, and compensation voltage terminal TB, or may further include other terminals according to a circuit configuration thereof. For example, any one of the first or second input terminal V1 or V2 may be omitted. In addition, a connection relationship between the plurality of driving stages SRC1 to SRCn may be changed.

Figure 6:
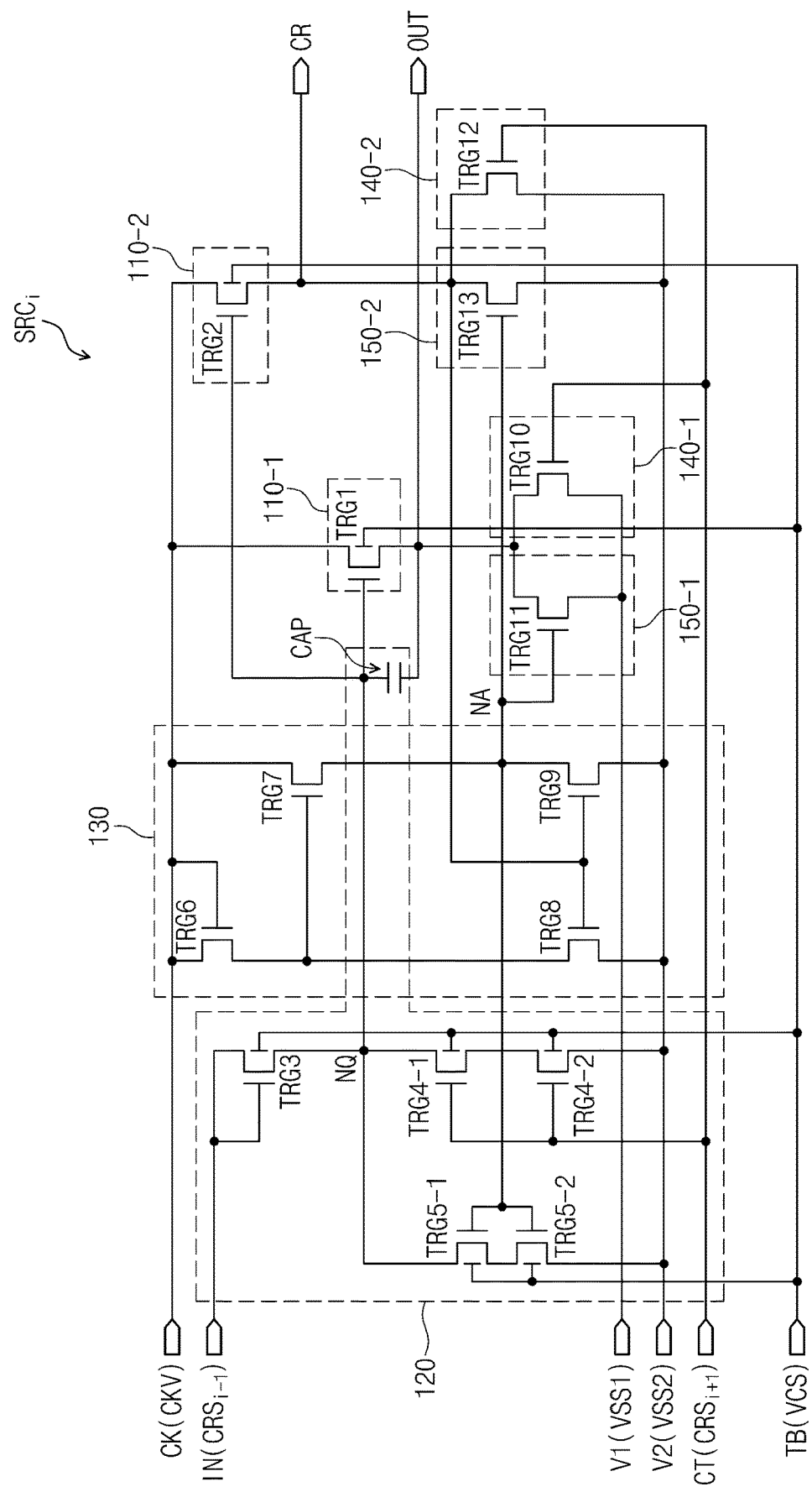
FIG. 6 is a circuit diagram of an i-th driving stage among a plurality of stages illustrated in FIG. 5.
Figure 7:
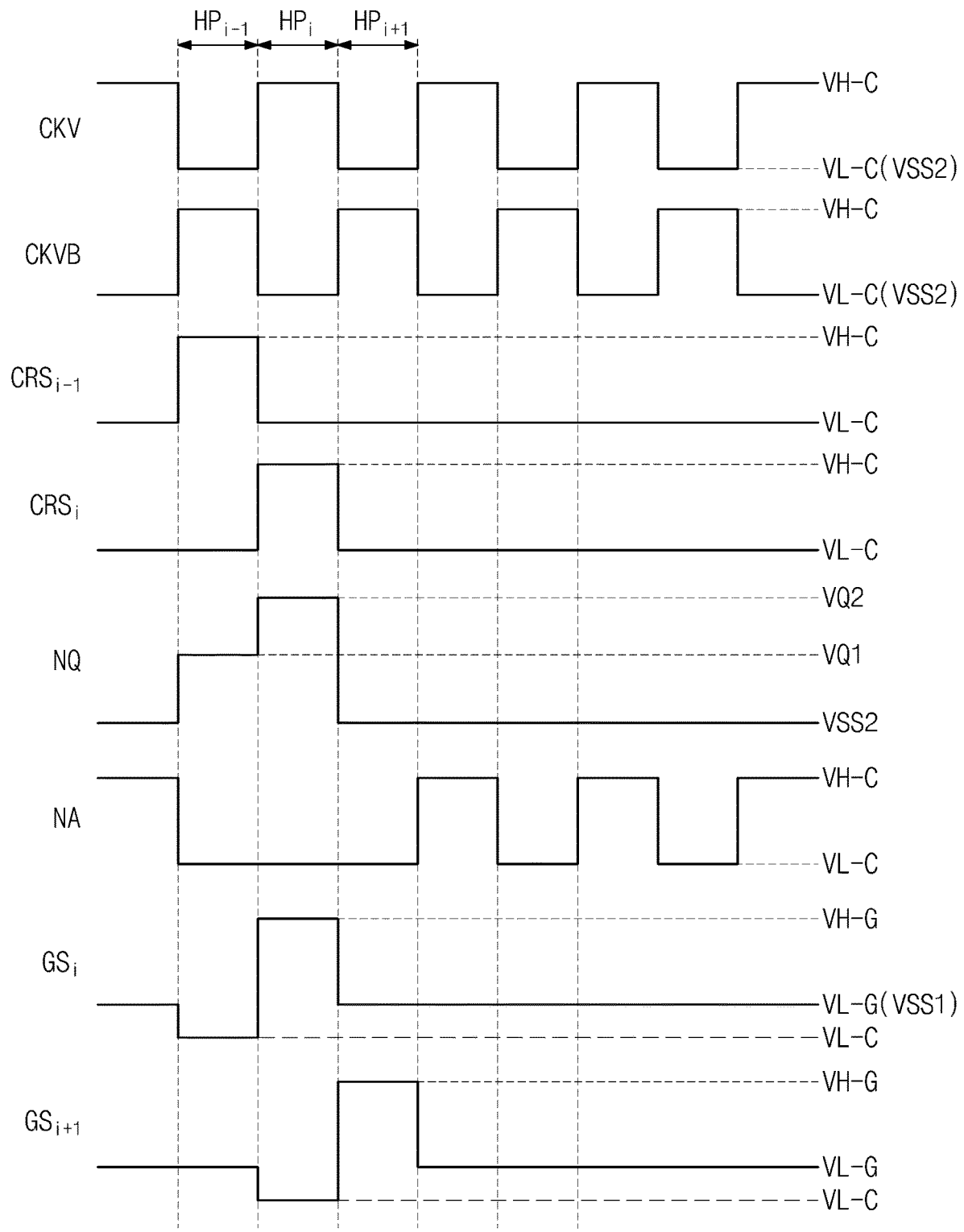
FIG. 7 is an input and output signal waveform diagram of the i-th driving stage illustrated in FIG. 6.

FIG. 6 is a circuit diagram of an i-th driving stage among a plurality of stages illustrated in FIG. 5. FIG. 7 is an input and output signal waveform diagram of an i-th driving stage illustrated in FIG. 6.

FIG. 6 exemplarily illustrates an i-th driving stage $SRC_i$ among the plurality of driving stages SRC1 to SRCn illustrated in FIG. 5. Each of the plurality of driving stages SRC1 to SRCn illustrated in FIG. 6 may have the same circuit as the i-th driving stage $SRC_i$.

Referring to FIGS. 6 and 7, the i-th driving stage $SRC_i$ includes output units 110-1 and 110-2, a controller 120, an inverter unit 130, pull down units 140-1 and 140-2, and holding units 150-1 and 150-2. The output units 110-1 and 110-2 include a first output unit 110-1 outputting an i-th gate signal GSi and a second output unit 110-2 outputting an i-th carry signal CRSi. The pull down units 140-1 and 140-2 include a first pull down unit 140-1 pulling down the output terminal OUT and a second pull down unit 140-2 pulling down the carry terminal CR. The holding unit 1501-1 and 150-2 include a first holding unit 150-1 holding the output terminal OUT in the pull-down state and a second holding unit 150-2 holding the carry terminal CR in the pull-down state.

The i-th driving stage $SRC_i$ includes a plurality of driving transistors TRG1 to TRG13 (hereinafter TRG). The driving transistors TRG are classified according to roles into output transistors TRG1 and TRG2, control transistors TRG3 and TRG4-1, TRG4-2, TRG5-1, and TRG5-2, inverter transistors TRG6, TRG7, TRG8, and TRG9, pull down transistors TRG10 and TRG12, and holding transistors TG11 and TRG13.

The circuit of the i-th driving stage $SRC_i$ is just an example and may be changed.

The first output unit 110-1 includes the first output transistor TRG1. The first output transistor TRG1 includes an input electrode receiving the first clock signal CKV, a first control electrode connected to a Q-node NQ, a second control electrode connected to the compensation voltage terminal TB, and an output electrode outputting the i-th gate signal GSi.

The second output unit 110-2 includes the second output transistor TRG2. The second output transistor TRG2 includes an input electrode receiving the first clock signal CKV, a first control electrode connected to the Q-node NQ, a second control electrode connected to the compensation voltage terminal TB, and an output electrode outputting the i-th carry signal CRSi.

As illustrated in FIG. 7, the first clock signal CKV and the second clock signal CKVB may have different phases. The first clock signal CKV and the second clock signal CKVB may have a phase difference of 180 degree. Each of the first clock signal CKV and second clock signal CKVB includes low periods VL-C (low voltage) having a low level and high periods VH-C (high voltage) having a relatively high level. Each of the first clock signal CKV and the second clock signal CKVB may have alternating low and high periods.

The high voltage VH-C may be about 10V. The low voltage VL-C may be about −16V. The low voltage VL-C may have the same level as the second low voltage VSS2.

The i-th gate signal GSi includes a low period VL-G (low voltage) having a low level and a high period VH-G (high voltage) having a relatively high level. The low voltage VL-G of the i-th gate signal GSi may have the same level as the first low voltage VSS1. The low voltage VL-C may be about −13V.

The i-th gate signal GSi may have the same level as the low voltage VL-C of the first or second clock signal CKV or CKVB during some of periods. The low voltage VL-C of the first or second clock signal CKV or CKVB is output by the Q-node pre-charged before the i-th gate signal GSi becomes the high voltage VH-G.

The high voltage VH-G of the i-th gate signal GSi may have the same level as the high voltage VH-C of the first or second clock signal CKV or CKVB.

The i-th carry signal CRSi includes a low period VL-C (low voltage) having a low level and a high period VH-C (high voltage) having a relatively high level. Since generated based on the first clock signal CKV, the i-th carry signal CRSi has an identical/similar voltage level to that of the first clock signal CKV.

Referring to FIGS. 6 and 7, the controller 120 may control operations of the first and second output units 1101-1 and 110-2. The controller 120 turns on the first and second output units 110-1 and 110-2 in response to an (i−1)th carry signal CRSi−1 output from an (i−1)th driving stage $SRC_{i-1}$. The controller 120 turns off the first and second output units 110-1 and 110-2 in response to an (i+1)th carry signal CRSi+1 output from (i+1)th driving stage. The controller 120 also maintains a turn-off of the first and second output units 110-1 and 110-2 according to a switching signal output from the inverter unit 130.

The controller 120 includes a first control transistor TRG3, second control transistors TRG4-1 and TRG4-2, third control transistors TRG5-1, TRG5-2, and a capacitor CAP. In the present embodiment, two serially connected second control transistors TRG4-1 and TG4-2 and two serially connected third control transistors TRG5-1 and TRG5-2 are exemplarily illustrated, which prevent a leakage current, but are not limited hereto.

The first control transistor TRG3 outputs a control signal for controlling a potential of the Q-node NQ to the Q-node NQ. In FIG. 7, a horizontal period $HP_i$ (hereinafter i-th horizontal period) during which the i-th gate signal GSi is output, a horizontal period $HP_{i-1}$ immediately prior to the i-th horizontal period (hereinafter, (i−1)th horizontal period), and a horizontal period $HP_{i+1}$ immediately following the i-th horizontal period (hereinafter (i+1)th horizontal period) are illustrated.

The first control transistor TRG3 is connected in a diode type between the input terminal IN and the Q-node NQ to allow a current to flow only in a direction to the Q-node NQ. The first control transistor TRG3 includes the first control electrode and input electrode commonly connected to the input terminal IN, a second control electrode connected to the compensation voltage terminal TB, and an output electrode connected to the Q-node NQ.

The capacitor CAP is connected between an output electrode of the first output transistor TRG1 and a first control electrode (or Q-node NQ) of the first output transistor TRG1.

The two second control transistors TG4-1 and TRG4-2 are connected in series between the second voltage input terminal V2 and the Q-node NQ. First control electrodes of the second control transistors TRG4-1 and TRG4-2 are connected to the control terminal CT, and second control electrodes are connected to the compensation voltage terminal TB. The two second control transistors TRG4-1 and TRG4-2 provide the second low voltage VSS2 to the Q-node NQ in response to an (i+1)th carry signal (not illustrated) output from an (i+1)th stage. In another embodiment of the inventive concept, the two second control transistors TRG4-1 and TRG4-2 may be turned on by an (i+1)th gate signal $GS_{i+1}$.

The two third control transistors TG5-1 and TRG5-2 are connected in series between a second voltage input terminal V2 and the Q-node NQ. First control electrodes of the two third control transistors TRG5-1 and TRG5-2 are connected to an A-node NA, and second control electrodes are connected to the compensation voltage terminal TB. The two third control transistors TRG5-1 and TRG5-2 provide the second low voltage VSS2 to the Q-node NQ in response to a switching signal output from the inverter unit 130.

In some embodiment of the inventive concept, any one of the two second control transistors TRG4-1 and TRG4-2 may be omitted, and any one of the two third control transistors TRG5-1 and TRG5-2 may be omitted. In addition, any one of the second control transistors TRG4-1 and TRG4-2 and the third control transistors TRG5-1 and TRG5-2 may be connected to the first voltage input terminal V1 instead of the second voltage input terminal V2.

Exemplary embodiments of the inventive concept are described below in more detail with reference to the accompanying drawings. The inventive concept may, however, be embodied in different forms and is not limited to the embodiments set forth herein. Rather, these embodiments are provided to help convey the scope of the inventive concept to those skilled in the art.

As illustrated in FIG. 7, a potential of the Q-node NQ is increased to a first high voltage VQ1 by an (i−1)th carry signal CRSi−1 during an (i−1)th horizontal period $HP_{i-1}$. When the (i−1)th carry signal $CRS_{i-1}$ is applied to the Q-node NQ, the capacitor CAP is charged with a corresponding voltage. An i-th gate signal GSi is output for the i-th horizontal period. At this point, the Q-node NQ is boosted from the first high voltage VQ1 to the second high voltage VQ2.

A voltage of the Q-node NQ is pulled down to the second low voltage VSS2 for an (i+1)th horizontal period $HP_{i+1}$. Accordingly, the first and second output transistors TRG1 and TRG2 are turned off. After the (i+1)th horizontal period HPi+1 and before output of the i-th gate signal GSi in the next frame period, a voltage of the Q-node NQ is maintained as the second low voltage VSS2. Accordingly, after the (i+1)th horizontal period $HP_{i+1}$ and before output of the i-th gate signal GSi in the next frame period, the off states of the first and second output transistors TRG1 and TRG2 are maintained.

Referring to FIGS. 6 and 7, the inverter unit 130 outputs a switching signal to the A-node NA. The inverter unit 130 includes first to fourth inverter transistors TRG6, TRG7, TRG8 and TRG9. The first inverter transistor TRG6 includes an input electrode and a control electrode commonly connected to the clock terminal CK, and an output electrode connected to the control electrode of the second inverter transistor TRG7. The second inverter transistor TRG7 includes an input electrode connected to the clock terminal CK, an output electrode connected to the A-node NA, and a control electrode connected to an output electrode of the first inverter transistor TRG6.

The third inverter transistor TRG8 includes an output electrode connected to the output electrode of the first inverter transistor TRG6, a control electrode connected to the carry terminal CR, and an input electrode connected to the second voltage input terminal V2. The fourth inverter transistor TRG9 includes an output electrode connected to the A-node NA, a control electrode connected to the carry terminal CR, and an input electrode connected to the second voltage input terminal V2. In another embodiment of the inventive concept, control electrodes of third and fourth transistors TRG8 and TRG9 may be connected to the output terminal OUT, and input electrodes of the third and fourth inverter transistors TRG8 and TRG9 may be connected to the first voltage input terminal V1

As illustrated in FIG. 7, the A-node NA has substantially the same phase as the first clock signal CKV except for the i-th horizontal period $HP_i$. The third and fourth inverter transistors TRG8 and TRG9 are turned on in response to the i-th carry signal CRSi for the i-th horizontal period $HP_i$. At this point, the high voltage VH-C of the first clock signal CKV output from the second inverter transistor TRG7 is discharged to the second low voltage VSS2. The high voltage VH-C and the low voltage VL-C of the first clock signal CKV output from the second inverter transistor TRG7 is provided to the A-node NA for periods except the i-th horizontal period $HP_i$. The alternating high voltage VH-C and low voltage VL-C of the first clock signal CKV are provided to other transistors as a switching signal.

The first pull down unit 140-1 includes a first pull down transistor TRG10. The first pull down transistor TRG10 includes an input electrode connected to the first voltage input terminal V1, a control electrode connected to the control terminal CT, and an output electrode connected to an output electrode of the first output transistor TRG1. In another embodiment of the inventive concept, an input electrode of the first pull down transistor TRG10 may be connected to the second voltage input terminal V2.

As illustrated in FIG. 7, a voltage of the i-th gate signal GSi after the (i+1)th horizontal period $HP_{i+1}$ corresponds to a voltage of the output electrode of the first output transistor TRG1. The first pull down transistor TRG10 provides the first low voltage VSS1 to the output electrode of the first output transistor TRG1 in response to the (i+1) carry signal during the (i+1) horizontal period $HP_{i+1}$.

The second pull down unit 140-2 includes a second pull down transistor TRG12. The second pull down transistor TRG12 includes an input electrode connected to the second voltage input terminal V2, a control electrode connected to the control terminal CT, and an output electrode connected to an output electrode of the second output transistor TRG2. In another embodiment of the inventive concept, an input electrode of the second pull down transistor TRG12 may be connected to the first voltage input terminal V1.

As illustrated in FIG. 7, a voltage of the i-th gate signal GSi after the (i+1)th horizontal period $HP_{i+1}$ corresponds to a voltage of the output electrode of the second output transistor TRG2. The second pull down transistor TRG12 provides the second low voltage VSS2 to the output electrode of the second output transistor TRG2 in response to the (i+1) carry signal for the (i+1) horizontal period $HP_{i+1}$.

The first holding unit 150-1 includes a first holding transistor TRG11. The first holding transistor TRG11 includes an input electrode connected to the first voltage input terminal V1, a control electrode connected to the A-node NA, and an output electrode connected to the output electrode of the first output transistor TRG1. In another embodiment of the inventive concept, an input electrode of the first holding transistor TRG11 may be connected to the second voltage input terminal V2.

As illustrated in FIG. 7. the first holding transistor TRG11 after the (i+1) horizontal period $HP_{i+1}$ provides the first low voltage VSS1 to the output electrode of the first output transistor TRG1 in response to the switching signal output from the A-node NA.

The second holding unit 150-2 includes a second holding transistor TRG13. The second holding transistor TRG13 includes an input electrode connected to the second voltage input terminal V2, a control electrode connected to the A-node NA, and an output electrode connected to an output electrode of the second output transistor TRG2. In another embodiment of the inventive concept, an input electrode of the second holding transistor TRG13 may be connected to the first voltage input terminal V1.

As illustrated in FIG. 7. the second holding transistor TRG13 after the (i+1) horizontal period $HP_{i+1}$ provides the second low voltage VSS2 to the output electrode of the second output transistor TRG2 in response to the switching signal output from the A-node NA.

In the present embodiment, only the output transistors TRG1 and TRG2 connected to the Q-node NQ and the control transistors TRG3, TRG4-1, TRG4-2, TRG5-1, and TRG5-2 include the second control electrode. This is because the output transistors TRG1 and TRG2 connected to the Q-node NQ and the control transistors TRG3, TRG4-1, TRG4-2, TRG5-1, and TRG5-2 most predominantly affect the output of the i-th driving stage $SRC_i$ to control a threshold voltage. However, the driving transistors TRG including the second control electrode are not limited hereto. Other combinations in which one or more of the driving transistors TRG include the second control electrode may be used.

Figure 8:
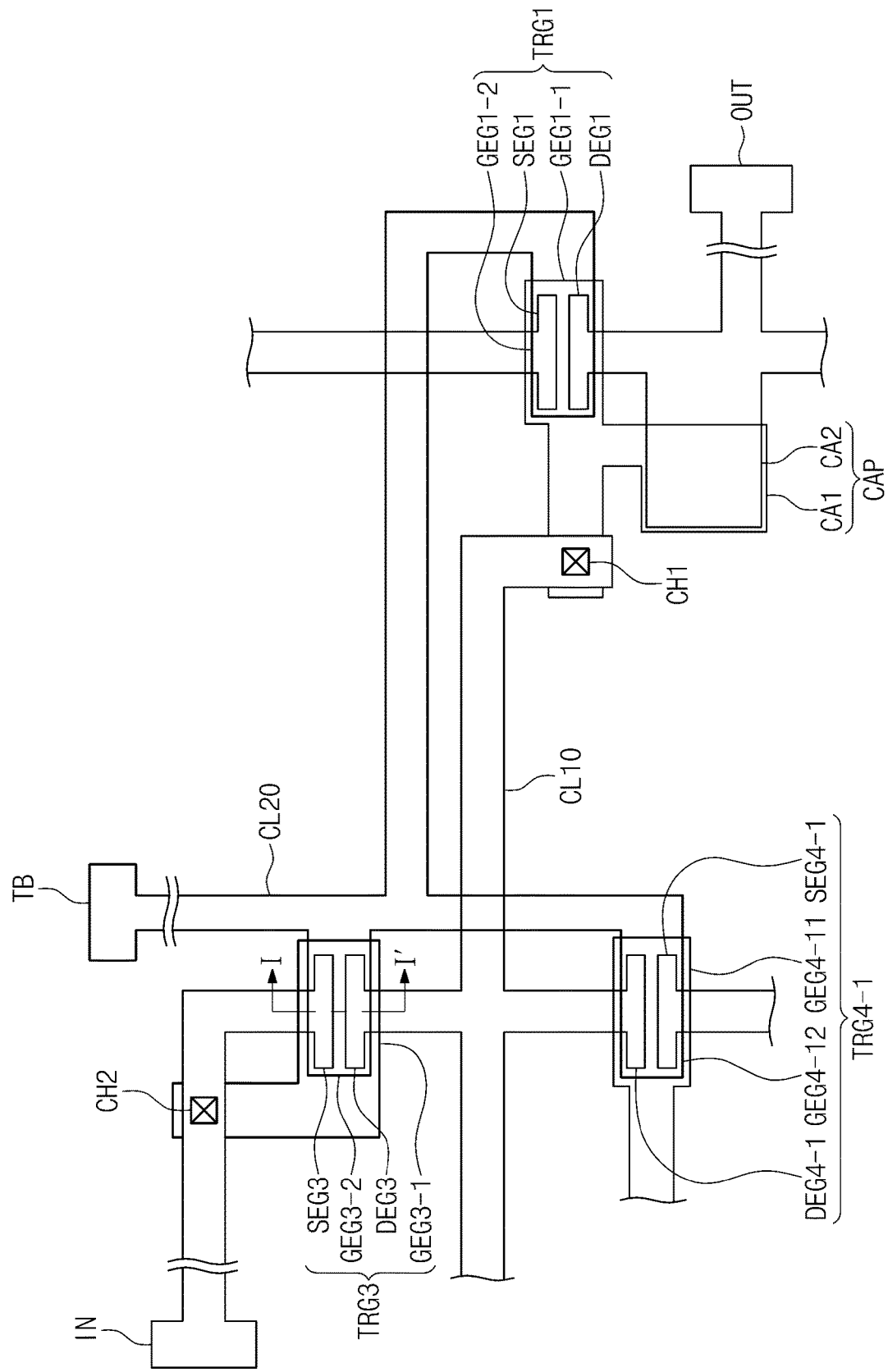
FIG. 8 is a layout of a part of the driving stage circuit illustrated in FIG. 6.
Figure 9:
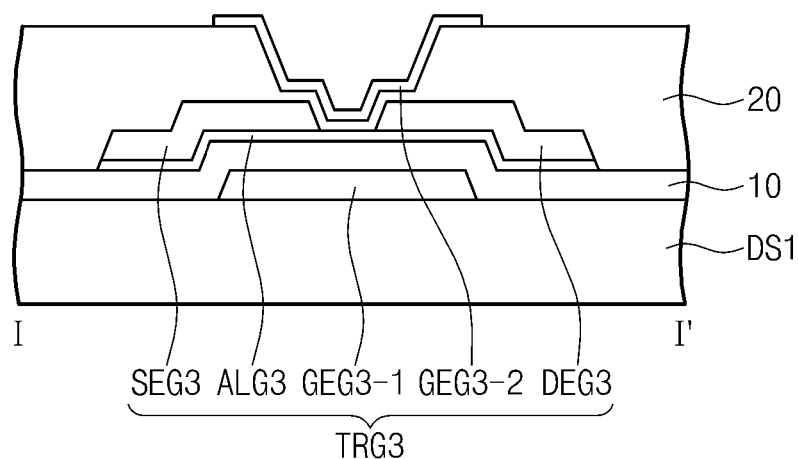
FIG. 9 is a cross-sectional view of a driving transistor including a second control electrode according to an embodiment of the inventive concept.

FIG. 8 is a layout of a part of the driving stage circuit illustrated in FIG. 6. FIG. 9 is a cross-sectional view of a driving transistor including a second control electrode according to an embodiment of the inventive concept.

FIG. 8 illustrates the first output transistor TRG1, the first control transistor TRG3, and the second control transistor TRG4-1 of the i-th driving stage $SRC_i$ (see FIG. 6), and a connection structure thereof. As described later, the first output transistor TRG1, the first control transistor TRG3, and the second control transistor TRG4-1 have an identical structure.

In detail, the i-th driving stage $SRC_i$ includes a first conductive layer, a second conductive layer, a third conductive layer, and an activation layer disposed on different layers. The first conductive layer, second conductive layer, and third conductive layer may include a plurality of patterned electrodes and interconnections. The activation layer includes a plurality of patterned parts. Insulation layers are disposed between adjacent layers of the first conductive layer, second conductive layer, and third conductive layer.

As illustrated in FIGS. 8 and 9, a portion of the first conductive layer configures first control electrodes GEG1-1, GEG3-1, and GEG4-11 of the driving transistors TRG1, TRG3, and TRG4-1. A portion of the second conductive layer forms input electrodes SEG1, SEG3, and SEG4-1, and output electrodes DEG1, DEG3, and DEG4-1 of the transistors TRG1, TRG3, and TRG4-1. A portion of the third conductive layer configures second control electrodes GEG1-2, GEG3-2, and GEG4-12 of the transistors TRG1, TRG3, and TRG4-1.

The second conductive layer may include a first interconnection CL10 connecting the transistors TRG1, TRG3, and TRG4-1. The first interconnection CL10 corresponds to the Q-node NQ illustrated in FIG. 6. In addition, the third conductive layer may include the second interconnection CL20 connecting the second control electrodes GEG1-2, GEG3-2, and GEG4-12 and the compensation voltage terminal TB.

The first control electrode GEG1-1 of the first output transistor TRG1 and the first interconnection CL10 may be connected through a first contact hole CH1 penetrating through an insulation layer disposed between the first and second conductive layers. The first control electrode GEG-1 of the first output transistor TRG1 is connected to a first electrode CA1 of the capacitor CAP. An output electrode DEG1 of the first output transistor TRG1 is connected to a second electrode CA2 of the capacitor CAP.

The first control electrode GEG3-1 of the first control transistor TRG3 may be connected to an input electrode SEG3 and an input terminal IN of the first control transistor TRG3 through a second contact hole CH2 penetrating the insulation layer disposed between the first and second conductive layers.

FIG. 9 is a cross-sectional view illustrating a cross section cut along line I-I' of FIG. 8.

Referring to FIGS. 4 and 9, the first control electrode GEG3-1 of the first control transistor TRG3 is disposed on the same layer as the pixel control electrode GEP of the pixel transistor TRP. The first control electrode GEG3-1 of the first control transistor TRG3 may be formed of the same material as and have the same layer structure as the pixel control electrode GEP of the pixel transistor TRP.

The input electrode SEG3 and output electrode DEG3 of the first control transistor TRG3 are disposed on the same layer as the pixel input electrode SEP and pixel output electrode DEP of the pixel transistor TRP. The input electrode SEG3 and output electrode DEG3 of the first control transistor TRG3 may be formed of the same material as and have the same layer structure as the pixel input electrode SEP and pixel output electrode DEP of the pixel transistor TRP.

The first insulation layer 10 is commonly disposed in the same layer structure in the first control transistor TRG3 and pixel transistor TRP.

The activation layer ALG3 of the first control transistor TRG3 is disposed on the same layer as the pixel activation layer ALP of the pixel transistor TRP. The activation layer ALG3 of the first control transistor TRG3 may be formed of the same material as and have the same layer structure as the pixel activation layer ALP of the pixel transistor TRP.

The first control transistor TRG3 may further include the second control electrode GEG3-2 in comparison to the pixel transistor TRP. The second control electrode GEG3-2 of the first control transistor TRG3 may be formed of the same material as that of the first control electrode GEG3-1. The control voltage VCS (see FIG. 6) generated in the control voltage generator 500 (see FIG. 1A) is applied to the second control electrode GEG3-2.

When applied to the second control electrode GEG3-2 of the first control transistor TRG3, the control voltage VCS (see FIG. 6) affects a degree of activation of a channel in the activation layer ALG3. When the control voltage VCS (see FIG. 6) is greater than about 0V, the channel is activated in the activation layer ALG3. Otherwise, the channel is not activated. This is considered as that a threshold voltage of the first control transistor TRG3 changes.

Although the first control transistor TRG3 is exemplarily illustrated in FIG. 9, the driving transistors TRG including the second control electrode may be formed of the same material as and have the same structure as the first control transistor TRG3.

Figure 10:
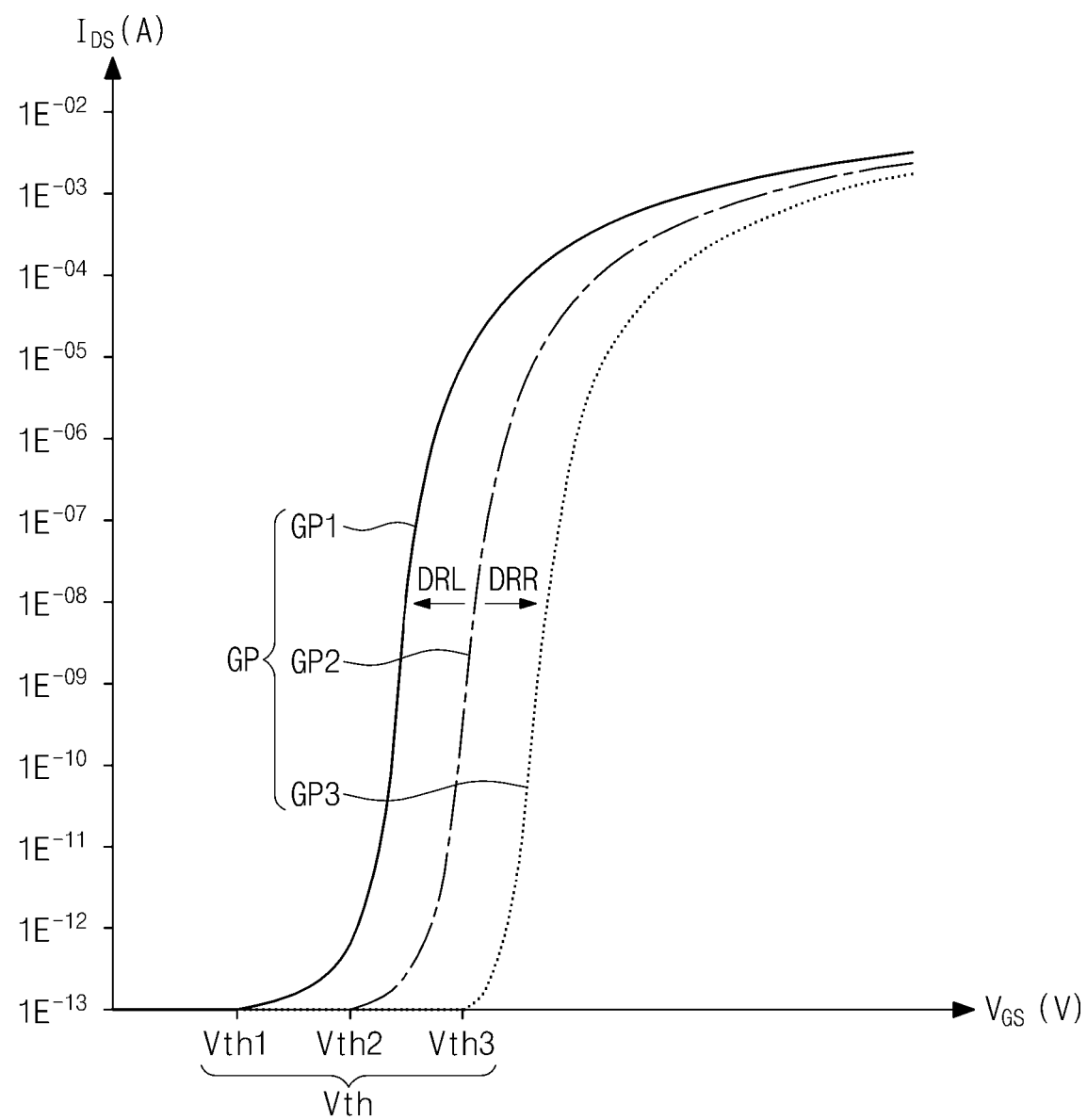
FIG. 10 is a graph representing a variation of a threshold voltage of a driving transistor according to environmental factors.

FIG. 10 is a graph representing a threshold voltage of a driving transistor varying according to environmental factors. A change of current graph GP according to temperature and illumination is illustrated in FIG. 10.

Referring to FIG. 10 in terms of temperature and under an assumption that illumination is uniform, a graph representing a driving characteristic of the driving transistor TRG at a reference temperature is a second current graph GP2. When the temperature is higher than the reference temperature, a graph representing the driving characteristic of the driving transistor TRG is a first current graph GP1. In other words, when the temperature is increased, the second current graph GP2 moves towards the left direction DRL to be the first current graph GP1. Accordingly, when the temperature is increased, the threshold voltage Vth of the driving transistor TRG is decreased to the first threshold voltage Vth1 from the second threshold voltage Vth2.

When the temperature is lower than the reference temperature, a graph representing the driving characteristic of the driving transistor TRG is a third current graph GP3. In other words, when the temperature is decreased, the second current graph GP2 moves towards the right direction DRR to be the third current graph GP3. Accordingly, when the temperature is decreased, the threshold voltage Vth of the driving transistor TRG is increased to the third threshold voltage Vth3 from the second threshold voltage Vth2.

In other words, when the temperature is increased, the threshold voltage Vth is decreased, and when the temperature is decreased, the threshold voltage Vth is increased.

Referring to FIG. 10 in terms of illumination and under an assumption that the temperature is constant, a graph representing a driving characteristic of the driving transistor TRG at a reference illumination is a second current graph GP2. When the illumination is higher than the reference illumination, a graph representing the driving characteristic of the driving transistor TRG is a first current graph GP1. In other words, when the illumination is increased, the second current graph GP2 moves towards the left direction DRL to be the first current graph GP1. Accordingly, when the temperature is increased, the threshold voltage Vth of the driving transistor TRG is decreased to the first threshold voltage Vth1 from the second threshold voltage Vth2.

When the illumination is lower than the reference illumination, a graph representing the driving characteristic of the driving transistor TRG is a third current graph GP3. In other words, when the illumination is decreased, the second current graph GP2 moves towards the right direction DRR to be the third current graph GP3. Accordingly, when the illumination is decreased, the threshold voltage Vth of the driving transistor TRG is increased to the third threshold voltage Vth3 from the second threshold voltage Vth2.

In other words, when the illumination is increased, the threshold voltage Vth is decreased, and when the illumination is decreased, the threshold voltage Vth is increased.

When the temperature and illumination simultaneously change, any one environmental factor of the two may be relatively further changed. For example, when a temperature change is relatively larger than the illumination change, the temperature may further affect a change in threshold voltage Vth in comparison to the illumination. In this case, despite an increase in illumination, the threshold voltage Vth may not be decreased but be increased by a temperature effect. In addition, despite a decrease in illumination, the threshold voltage Vth may not be increased but be decreased by a temperature effect.

A case in which illumination affects the change in threshold voltage Vth more than temperature is similar to the above-described content and is omitted.

In such a way, the threshold voltage Vth of the driving transistors TRG (see FIG. 9) is also changed by surrounding environmental factors. Accordingly, as an embodiment of the inventive concept, despite of surrounding environmental factors, when the threshold voltage Vth may be maintained constant, a gate driving circuit and a display device having high reliability may be provided.

Figure 11A:
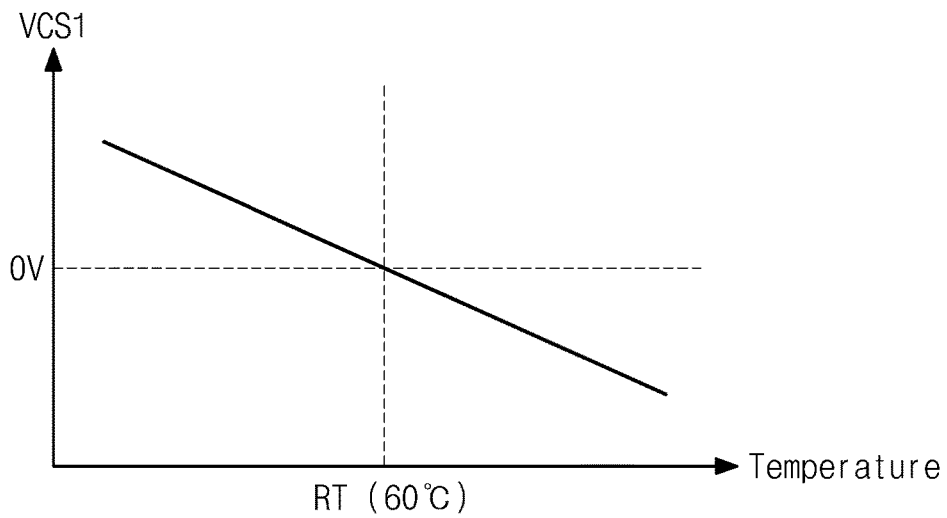
FIG. 11A is a graph representing a relationship between temperature and a first control voltage according to an embodiment of the inventive concept.

FIG. 11A is a graph representing a relationship between temperature and a first control voltage according to an embodiment of the inventive concept. FIG. 11B is a graph representing a relationship between illumination and a second control voltage according to an embodiment of the inventive concept. FIG. 12 is a graph representing a change in threshold voltage of a driving transistor by a control voltage according to an embodiment of the inventive concept.

Referring to FIG. 11A, assuming that there is no change in illumination, temperature and a first control voltage VCS1 are in a proportional relationship, and at this point, a proportional constant is a negative number. In other words, as the temperature is increased, the first control voltage VCS1 is decreased, and as the temperature is decreased, the first control voltage VCS1 is increased.

Accordingly, in FIG. 10, when the threshold voltage Vth is moved towards the left direction DRL by a high temperature, the first control voltage VCS1 has a low voltage value. On the contrary, when the threshold voltage Vth is moved towards the right direction DRR by a low temperature, the first control voltage VCS1 has a high voltage value.

At a reference temperature RT, the first control voltage VCS1 is 0 V. When the temperature measured by the temperature sensor 310 is higher than the reference temperature RT, the first control voltage VCS1 is lower than 0 V. When the temperature measured by the temperature sensor 310 is lower than the reference temperature RT, the first control voltage VCS1 is higher than 0 V. The reference temperature RT may be about 50 to about 70. However, the reference temperature RT is not limited hereto, and may be changed according to the characteristics of the driving transistors TRG.

Figure 11B:
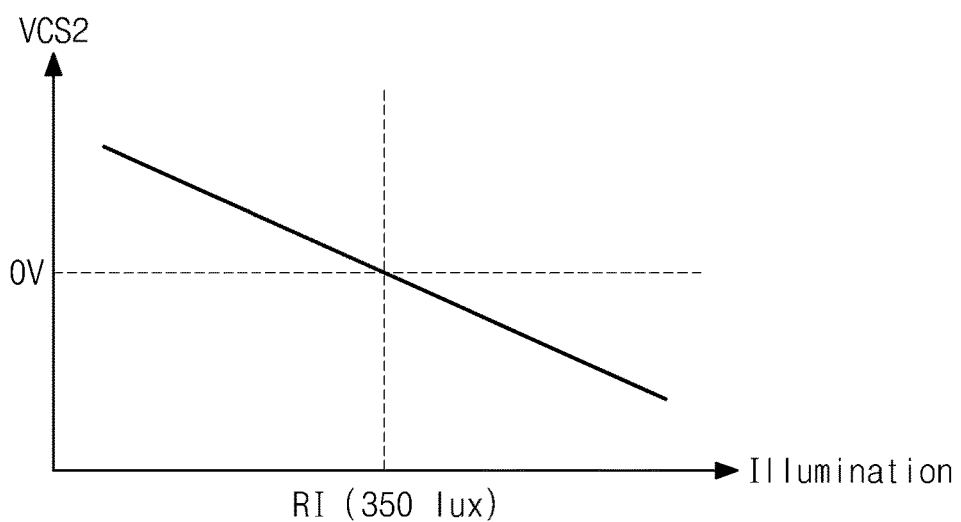
FIG. 11B is a graph representing a relationship between an illumination and a second control voltage according to an embodiment of the inventive concept.
Figure 12:
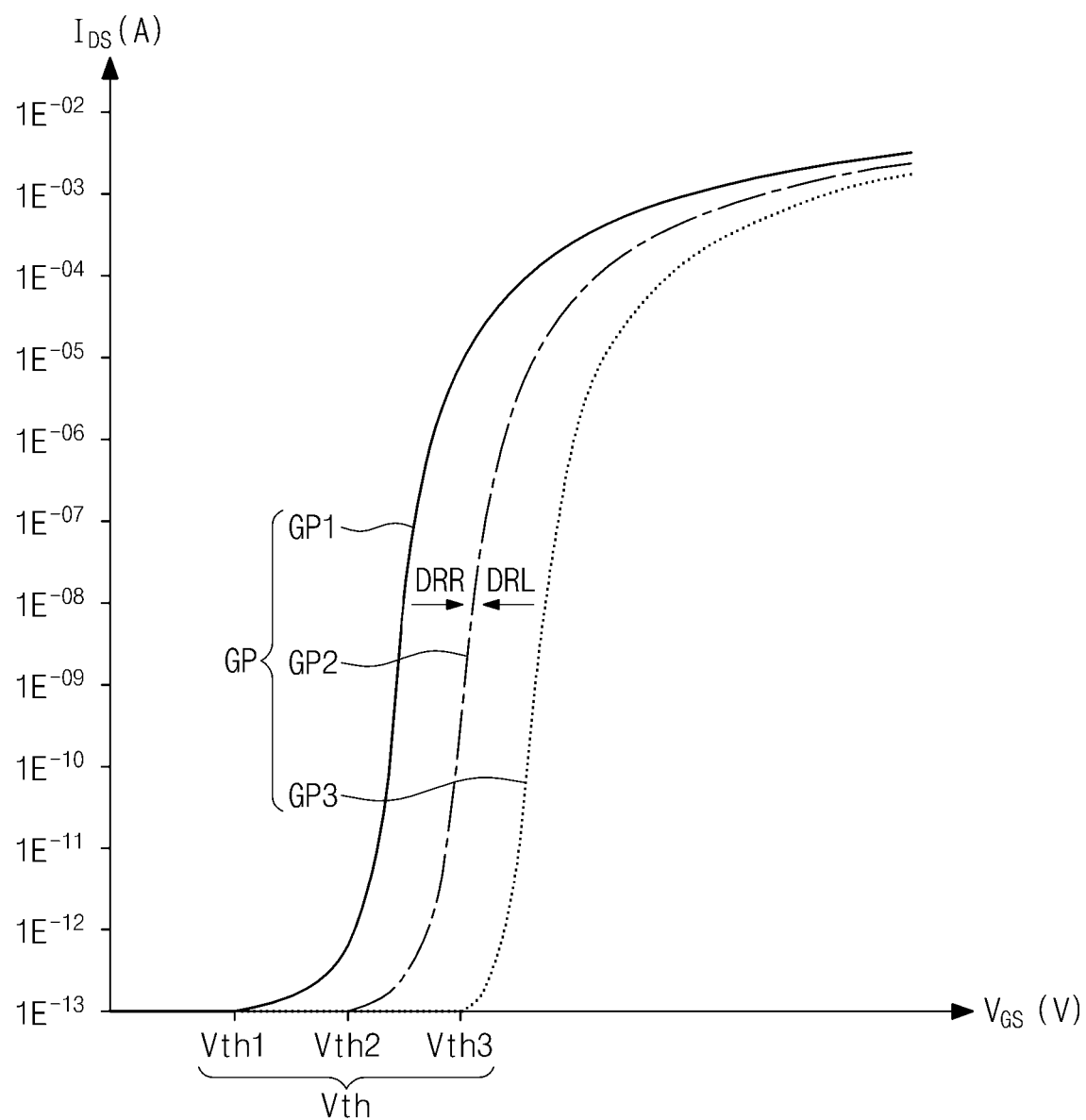
FIG. 12 is a graph representing a variation of a threshold voltage of a driving transistor by a control voltage according to an embodiment of the inventive concept.

Referring to FIG. 11B, assuming that there is no change in temperature, illumination and a second control voltage VCS2 are in a proportional relationship, and at this point, a proportional constant is a negative number. In other words, as the illumination is increased, the second control voltage VCS2 is decreased, and as the temperature is decreased, the second control voltage VCS2 is increased.

Accordingly, in FIG. 10, when the threshold voltage Vth is moved towards the left direction DRL by high illumination, the second control voltage VCS2 has a low voltage value. On the contrary, when the threshold voltage Vth is moved towards the right direction DRR by low illumination, the first control voltage VCS1 has a high voltage value.

At a reference illumination RI, the second control voltage VCS2 is 0 V. When illumination measured by the illumination sensor 320 is higher than the reference illumination RI, the second control voltage VCS2 is lower than 0 V. When illumination measured by the illumination sensor 320 is lower than the reference illumination RI, the second control voltage VCS2 is higher than 0 V. The reference illumination RI may be about 300 lux to 400 lux, for example, about 350 lux. However, the reference illumination RI is not limited hereto, and may be changed according to the characteristics of the driving transistors TRG.

That the control voltage VCS (see FIG. 5) applied to the control electrode may not be a simple arithmetic sum of the first and second control voltages VCS1 and VCS2 is described in relation to FIGS. 1A, 1B and 2, and accordingly is omitted here.

Referring FIG. 12, the threshold voltage Vth moves according to the control voltage VCS applied to the second control electrodes of the driving transistors TRG. FIG. 12 exemplarily illustrates a first current graph GP1, a second current graph GP2, and a third current graph GP3.

When it is assumed that a second threshold voltage Vth2 is a reference threshold voltage at a reference temperature, a first threshold voltage Vth1 is a threshold voltage when the temperature is higher than the reference temperature, and a third voltage threshold Vth3 is a threshold voltage when the temperature is lower than the reference temperature.

When it is assumed that a second threshold voltage Vth2 is a reference threshold voltage at a reference illumination, the first threshold voltage Vth1 is a threshold voltage when the illumination is higher than the reference illumination, and the third voltage threshold Vth3 is a threshold voltage when the illumination is lower than the reference illumination.

When the control voltage VCS is higher than 0 V, the first threshold voltage Vth1 is moved towards the right direction DRR to be the second threshold voltage Vth2. Accordingly, a change in threshold voltage Vth by a high temperature or high illumination may be compensated. When the control voltage VCS is lower than 0 V, the third threshold voltage Vth3 is moved towards the left direction DRL to be the second threshold voltage Vth2. Accordingly, a change in threshold voltage Vth by a low temperature or low illumination may be compensated.

Figure 13:
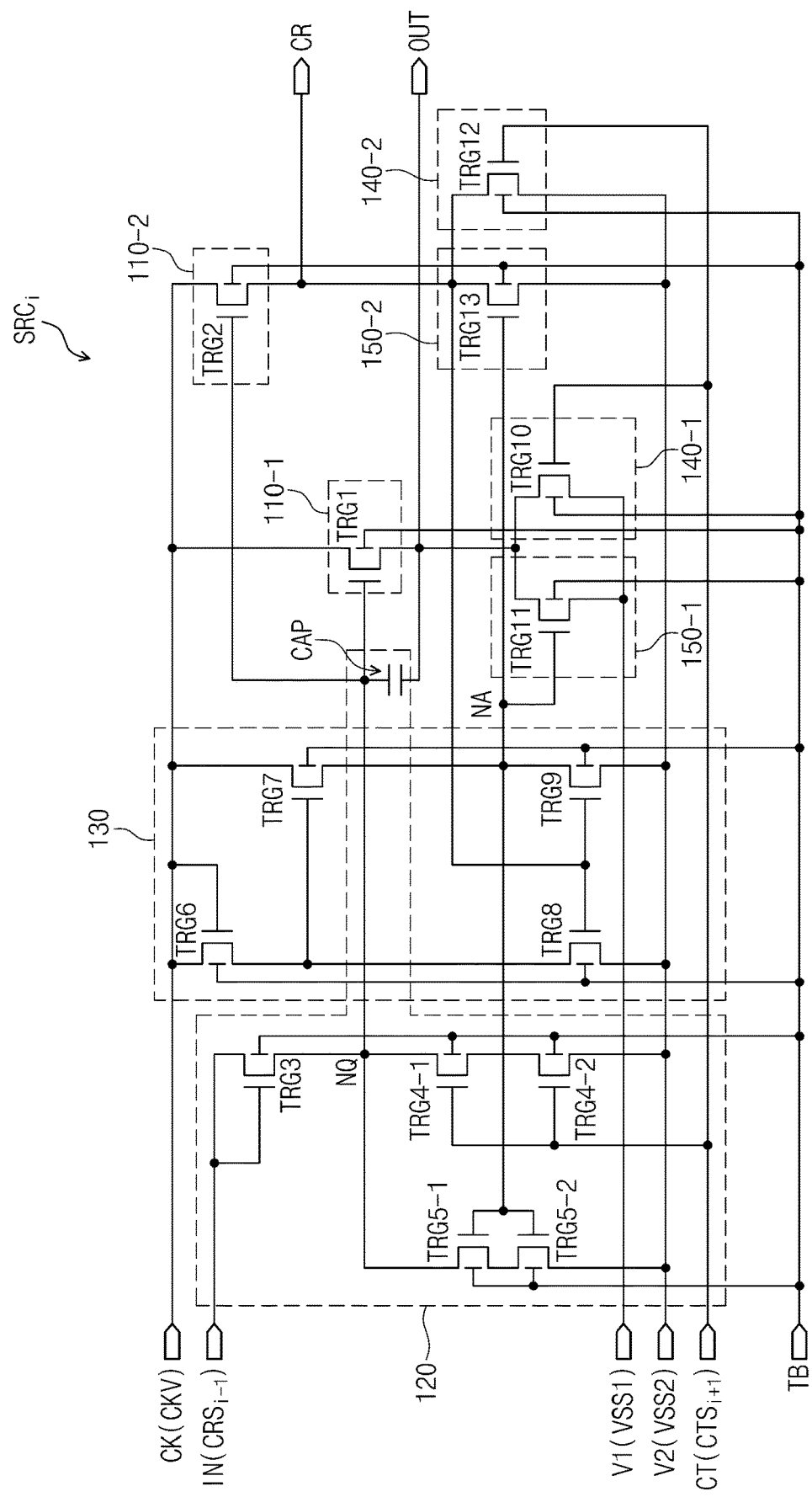
FIG. 13 is a circuit diagram of an i-th driving stage among a plurality of stages illustrated in FIG. 5 according to an embodiment of the inventive concept.

FIG. 13 is a circuit diagram of i-th driving stage among the plurality of stages illustrated in FIG. 5 according to an embodiment of the inventive concept.

In the i-th driving stage $SRC_i$ of FIG. 13, all driving transistors TRG include the second control electrodes. A threshold voltage Vth (see FIG. 10) of all the driving transistors TRG of the i-th driving stages $SRC_i$ may be changed by surrounding temperature or illumination. Unlike FIG. 6, in the present embodiment, a gate driving circuit and a display device having high reliability may be provided by compensating for changes in the threshold voltage Vth of all the driving transistors TRG.

According to an embodiment of the inventive concept, variation of a threshold voltage of a gate driving circuit by environmental factors around a display panel can be compensated. Accordingly, a gate driving circuit having high reliability and a display device including the same can be provided.

The above-disclosed subject matter is to be considered illustrative and not restrictive, and the appended claims are intended to cover all such modifications, enhancements, and other embodiments, which fall within the true spirit and scope of the inventive concept. Thus, the scope of the inventive concept is to be determined by the following claims and their equivalents, and shall not be restricted or limited by the foregoing detailed description.

What is claimed is:

1. A display device comprising:
   a display panel comprising a plurality of gate lines, a plurality of data lines, and a plurality of pixels connected to the plurality of gate lines and the plurality of data lines, each of the plurality of pixels comprises a pixel transistor that comprises a pixel input electrode, a pixel output electrode and a pixel control electrode;

a gate driving circuit providing gate signals to the pixel control electrode that electrically connected to one of the plurality of gate line and comprising driving transistors that each comprise a first control electrode activating a channel and a second control electrode overlapping the first control electrode;

a data driving circuit providing data signals to the pixel input electrode that electrically connected to one of the plurality of data lines;

a sensor part comprises a temperature sensor measuring temperature and an illumination sensor measuring illumination; and a control voltage generator applying to the second control electrode a control voltage for controlling a threshold voltage of the driving transistors on the basis of the temperature and the illumination measured by the sensor part, wherein the control voltage generator comprises:

a signal controller connected to the sensor part and configured to generate a first control voltage data on the basis of the temperature measured by the temperature sensor and a second control voltage data on the basis of the illumination measured by the illumination sensor; and an analog voltage generator configured to sum the first control voltage data and the second control voltage data, and output the control voltage.

2. The display device of claim 1, wherein the first control voltage is 0 V at a reference temperature, when a temperature measured by the temperature sensor is higher than the reference temperature, the first control voltage is lower than 0 V, and when the temperature measured by the temperature sensor is lower than the reference temperature, the first control voltage is higher than 0 V.

3. The display device of claim 2, wherein the reference temperature is about 50° C. to about 70° C.

4. The display device of claim 2, wherein the second control voltage is 0 V at a reference illumination, when the illumination is higher than the reference illumination, the second control voltage is lower than 0 V, and when the illumination is lower than the reference illumination, the second control voltage is higher than 0 V.

5. The display device of claim 4, wherein the reference illumination is about 300 lux to about 400 lux.

6. The display device of claim 1, further comprising a memory storing temperature-voltage data for determining the first control voltage on the basis of a temperature measured by the temperature sensor.

7. The display device of claim 6, wherein the memory further stores illumination-voltage data for determining the second control voltage on the basis of an illumination measured by the illumination sensor.

8. The display device of claim 7, further comprising a main circuit board on which the sensor part, the memory, and the control voltage generator are mounted, wherein the data driving circuit comprises a driving chip and a flexible circuit board on which the driving chip is mounted, wherein the flexible circuit board electrically connects the main circuit board and the display panel.

* * * * *